(12) United States Patent
Shintou et al.

(10) Patent No.: US 8,926,740 B2
(45) Date of Patent: Jan. 6, 2015

(54) PIGMENT DISPERSION, AND RESIST COMPOSITION FOR COLOR FILTER AND INK COMPOSITION EACH USING THE PIGMENT DISPERSION

(75) Inventors: Taichi Shintou, Saitama (JP); Takayuki Ujifusa, Ashigarakami-gun (JP); Masao Nakano, Kamakura (JP); Yutaka Tani, Yokohama (JP); Kaoru Takahashi, Saitama (JP); Satoshi Saito, Mishima (JP); Takayuki Toyoda, Yokohama (JP); Takeshi Miyazaki, Ebina (JP); Masashi Hirose, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/125,163
(22) PCT Filed: Jul. 24, 2012
(86) PCT No.: PCT/JP2012/069273
§ 371 (c)(1),
(2), (4) Date: Dec. 10, 2013
(87) PCT Pub. No.: WO2013/015434
PCT Pub. Date: Jan. 31, 2013

(65) Prior Publication Data
US 2014/0113231 A1 Apr. 24, 2014

(30) Foreign Application Priority Data
Jul. 27, 2011 (JP) ................................. 2011-163949

(51) Int. Cl.
*C09D 11/00* (2014.01)
*C09B 67/20* (2006.01)
(Continued)

(52) U.S. Cl.
CPC .............. *C09B 67/006* (2013.01); *G02B 5/223* (2013.01); *C09B 67/0033* (2013.01);
(Continued)

(58) Field of Classification Search
USPC ...................................... 106/31.77, 497, 498
See application file for complete search history.

(56) References Cited

U.S. PATENT DOCUMENTS

| 6,503,317 B1 * | 1/2003 | Ortalano et al. ............... 106/497 |
| 7,141,342 B2 * | 11/2006 | Toyoda et al. ........... 430/108.14 |

(Continued)

FOREIGN PATENT DOCUMENTS

| JP | 2002-022922 A | 1/2002 |
| JP | 2003-005361 A | 1/2003 |

(Continued)

OTHER PUBLICATIONS

English translation of JP 2004/292572; Oct. 2004.*

*Primary Examiner* — Helene Klemanski
(74) *Attorney, Agent, or Firm* — Fitzpatrick, Cella, Harper & Scinto

(57) ABSTRACT

To provide a pigment dispersion excellent in dispersibility and spectral characteristics. The pigment dispersion at least includes: a dispersion medium; a compound represented by a general formula (1), the compound being dispersed in the dispersion medium; and a pigment having a quinacridone skeleton, the pigment being dispersed in the dispersion medium:

General formula (1)

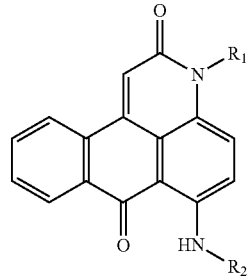

in the general formula (1), $R_1$ and $R_2$ each independently represent a hydrogen atom, an alkyl group, an aryl group, or an aralkyl group.

8 Claims, 2 Drawing Sheets

(51) Int. Cl.
*G02B 5/22* (2006.01)
*C09B 67/22* (2006.01)
*C09D 17/00* (2006.01)
*G03F 7/00* (2006.01)
*G03F 7/105* (2006.01)
*C09D 11/037* (2014.01)
*C09D 11/322* (2014.01)

(52) U.S. Cl.
CPC .............. *C09D 17/003* (2013.01); *C09D 11/00* (2013.01); *G03F 7/0007* (2013.01); *G03F 7/105* (2013.01); *C09D 11/037* (2013.01); *C09D 11/322* (2013.01)
USPC .......................... 106/31.77; 106/497; 106/498

(56) References Cited

U.S. PATENT DOCUMENTS

| | | | |
|---|---|---|---|
| 7,419,542 B2 * | 9/2008 | He et al. ........................ | 106/497 |
| 8,092,963 B2 * | 1/2012 | Vanbesien et al. .......... | 430/108.1 |
| 8,592,503 B2 * | 11/2013 | Bogale et al. ................. | 523/161 |
| 2008/0289541 A1 | 11/2008 | Goto et al. | |
| 2011/0189096 A1 | 8/2011 | Watanabe et al. | |
| 2011/0236310 A1 | 9/2011 | Watanabe et al. | |
| 2013/0029265 A1 * | 1/2013 | Solduga Ramirez et al. ......................... | 106/31.77 |
| 2013/0280169 A1 | 10/2013 | Watanabe et al. | |
| 2014/0113229 A1 * | 4/2014 | Tani et al. ................ | 430/108.21 |
| 2014/0162182 A1 * | 6/2014 | Nakano et al. ............. | 430/108.21 |
| 2014/0205773 A1 * | 7/2014 | Shintou et al. ............. | 428/32.39 |
| 2014/0225048 A1 * | 8/2014 | Saito et al. .................... | 252/586 |

FOREIGN PATENT DOCUMENTS

| | | |
|---|---|---|
| JP | 2004-292572 A | 10/2004 |
| JP | 2008-069343 A | 3/2008 |
| JP | 2009-227727 A | 10/2009 |
| WO | 2013/015433 A1 | 1/2013 |
| WO | 2013/051724 A1 | 4/2013 |

* cited by examiner

PIGMENT DISPERSION, AND RESIST COMPOSITION FOR COLOR FILTER AND INK COMPOSITION EACH USING THE PIGMENT DISPERSION

TECHNICAL FIELD

The present invention relates to a pigment dispersion to be used in a process for producing a paint, an ink, a color filter, a resin molded article, or the like, and a method of producing the pigment dispersion. The present invention also relates to a resist composition for a color filter and an ink composition each using the pigment dispersion as a colorant, and methods of producing the compositions.

BACKGROUND ART

In recent years, widespread use of a color image has been vigorous and hence a demand for an improvement in image quality is growing. In a digital full-color copying machine or printer, a color image original is subjected to color separation with respective filters of blue, green, and red colors, and then latent images corresponding to the original image are developed with respective developers of yellow, magenta, cyan, and black colors. Accordingly, a colorant in the developer of each color largely affects the image quality. In general, upon dispersion of a pigment in any one of the various media, it is difficult to make the pigment sufficiently fine or to uniformly disperse the pigment. In the production of a paint, an ink, a color filter, a resin molded article, or the like, a pigment dispersant has been utilized as an additive for reducing the particle diameter of a pigment to cause the pigment to sufficiently exert its performance as a coloring material (such as coloring power, transparency, or gloss).

A color filter is indispensable to enable a liquid crystal display to display a color and is hence an important part that determines the performance of the liquid crystal display. A dyeing method, a printing method, an inkjet method, a photoresist method, or the like has been known as a conventional method of producing the color filter. Of those, the photoresist method has become a mainstream production method in recent years because of the following reasons. The method facilitates the control and reproduction of spectral characteristics, and provides so high a resolution as to be capable of additionally high-definition patterning.

A pigment has been generally used as a colorant in the photoresist method. However, it has been known that the pigment involves a depolarization action (collapse of polarization) owing to its certain particle diameter, thereby reducing the contrast ratio of the color display of the liquid crystal display. In addition, in a system using the pigment, it is difficult to obtain high permeability for backlight and hence the extent of an improvement in brightness of the color filter is limited. Further, the pigment is insoluble in an organic solvent or a polymer. Accordingly, a colored resist composition is obtained as a dispersed product but it is difficult to stabilize the dispersion. In contrast, a dye is generally soluble in an organic solvent or a polymer and is hence stable even in a colored resist composition without causing agglomeration. Accordingly, a color filter obtained from a resist composition using the dye as a colorant is free of any depolarization action because the dye is being dispersed at a molecular level, and the color filter is excellent in permeability for backlight. A red color filter using C.I. Acid Red 6 that is a monoazo-based coloring matter has been reported so far because the filter has good spectral characteristics and enables image display with a high display contrast ratio (see PTL 1). As migration to broadband progresses, an image with an additionally high definition needs to be displayed. In view of the foregoing, the development of an additive for reducing the particle diameter of a pigment to cause the pigment to sufficiently exert its performance as a coloring material (such as coloring power, transparency, or gloss) has been strongly demanded in order that good spectral characteristics and a high contrast ratio can be realized.

CITATION LIST

Patent Literature

PTL 1: Japanese Patent Application Laid-Open No. 2003-005361

SUMMARY OF INVENTION

Technical Problem

An object of the present invention is to solve the problems. That is, an object of the present invention is to provide a pigment dispersion excellent in dispersibility of a pigment having a quinacridone skeleton and in spectral characteristics.

Another object of the present invention is to provide a resist composition for a color filter and an ink composition each using the pigment dispersion.

Solution to Problem

The objects of the present invention are achieved by the following invention.

That is, the present invention relates to a pigment dispersion, including: a dispersion medium; a compound represented by a general formula (1), the compound being dispersed in the dispersion medium; and a pigment having a quinacridone skeleton, the pigment being dispersed in the dispersion medium. In addition, the present invention provides a resist composition for a color filter and an ink composition each including the above-described pigment dispersion.

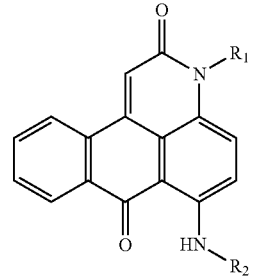

General formula (1)

(In the general formula (1), $R_1$ and $R_2$ each independently represent a hydrogen atom, an alkyl group, an aryl group, or an aralkyl group.)

Advantageous Effects of Invention

According to the present invention, a pigment dispersion excellent in dispersibility and a production method therefor can be provided. In addition, the present invention can also provide a resist composition for a color filter and an ink composition each having good red color tone by using the pigment dispersion.

Further features of the present invention will become apparent from the following description of exemplary embodiments with reference to the attached drawings.

DESCRIPTION OF EMBODIMENTS

Figure 1:
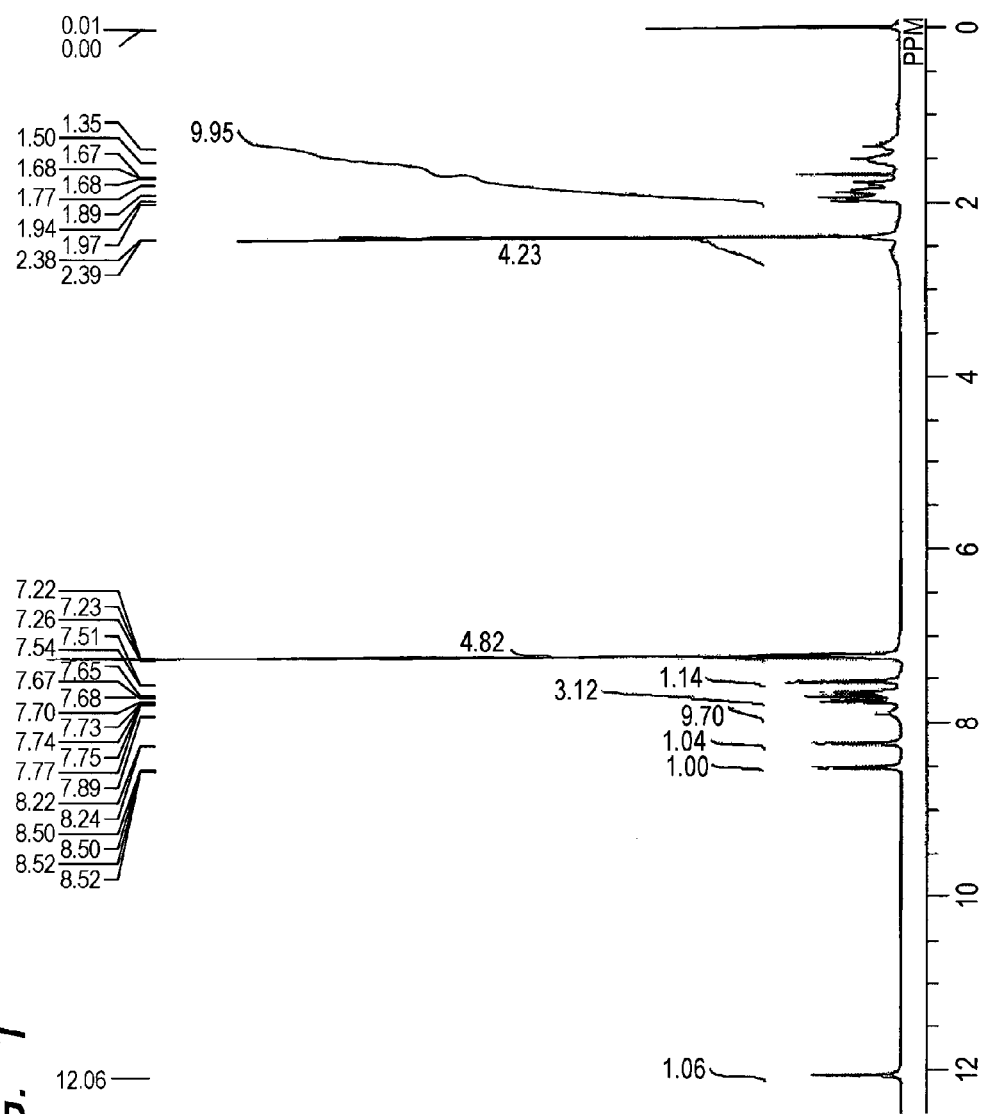
FIG. 1 is a view illustrating the $^1$H-NMR spectrum of a compound (16) represented by a general formula (1) of the present invention in CDCl$_3$ at room temperature and 400 MHz.

Hereinafter, the present invention is described in more detail by way of an embodiment. The inventors of the present invention have made extensive studies to solve the problems of the prior art, and as a result, have found that a pigment dispersion excellent in dispersibility is obtained by incorporating, into a dispersion medium, a compound represented by a general formula (1) and a pigment having a quinacridone skeleton. That is, the feature of the present invention is that the compound represented by the general formula (1) and the pigment having the quinacridone skeleton have affinities for each other, and hence a pigment dispersion preventing the reagglomeration of the pigment and showing a dispersion effect is obtained.

Examples thereof include: alkoxy groups such as a methoxy group, an ethoxy group, and a butoxy group; monosubstituted amino groups such as a methylamino group and a propylamino group; and disubstituted amino groups such as a dimethylamino group, a dipropylamino group, and an N-ethyl-N-phenyl group. In addition, when structures represented by R$_1$ and R$_2$ are each an aryl group or an aralkyl group, an alkyl group such as a methyl group, an ethyl group, a propyl group, or a butyl group, or an aryl group such as a phenyl group may be used.

R$_1$ preferably represents an alkyl group or an aryl group, and R$_1$ particularly preferably represents a methyl group, an n-butyl group, a cyclohexyl group, a 2-ethylhexyl group, or a 4-methylphenyl group because the dispersibility is improved.

The compound represented by the general formula (1) according to the present invention, which is commercially available, can be synthesized by a known method.

An embodiment of a method of producing the compound represented by the general formula (1) of the present invention is described, but the production method is not limited thereto.

That is, a compound B can be obtained by acetylating a compound A with acetic anhydride. Further, the compound is cyclized to provide a compound C. The compound C and an amine compound are condensed to provide the compound represented by the general formula (1) of the present invention. In addition, a person skilled in the art can appropriately make a selection as to whether a reaction such as a known protection-deprotection reaction or hydrolysis is added in a functional group of each compound as required.

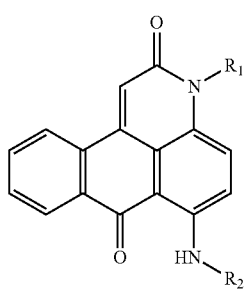

General formula (1)

(In the general formula (1), R$_1$ and R$_2$ each independently represent a hydrogen atom, an alkyl group, an aryl group, or an aralkyl group.)

Examples of the alkyl group represented by any one of R$_1$ and R$_2$ in the general formula (1) include, but not particularly limited to, linear, branched, or cyclic alkyl groups each having 1 to 20 carbon atoms such as a methyl group, a butyl group, an octyl group, a dodecyl group, a nonadecyl group, a cyclobutyl group, a cyclopentyl group, a cyclohexyl group, a methylcyclohexyl group, and an ethylhexyl group.

Examples of the aryl group represented by any one of R$_1$ and R$_2$ in the general formula (1) include, but not particularly limited to, 6- to 14-membered monocyclic or polycyclic aryl groups such as a phenyl group and a naphthyl group.

Examples of the aralkyl group represented by any one of R$_1$ and R$_2$ in the general formula (1) include, but not particularly limited to, a benzyl group and a phenethyl group.

Further, R$_1$ and R$_2$ may each have a substituent, and the substituent is not particularly limited as long as the substituent does not remarkably impair the stability of the compound.

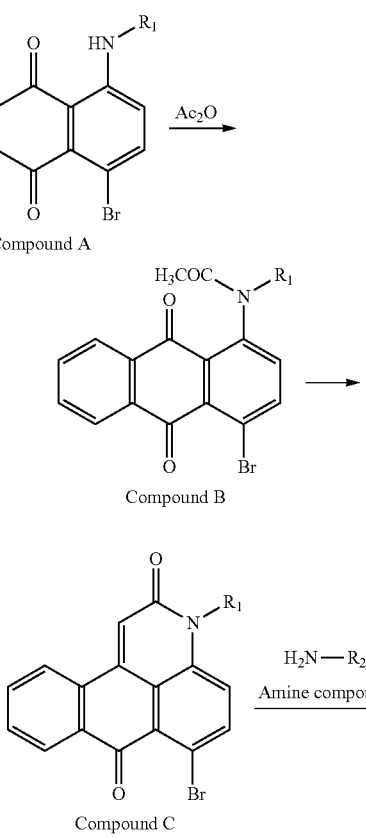

Compound A

Compound B

Compound C

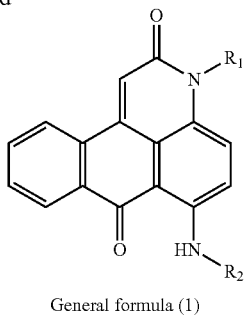

General formula (1)

The pigment having the quinacridone skeleton in the present invention can be represented by a general formula (2).

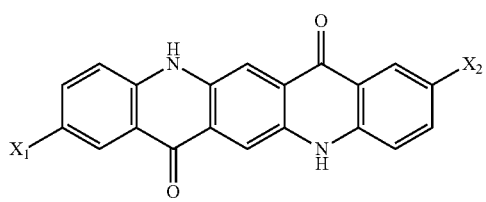

General formula (2)

(In the general formula (2), $X_1$ and $X_2$ each independently represent a hydrogen atom, an alkyl group, or a halogen atom.)

Examples of the alkyl group represented by any one of $X_1$ and $X_2$ in the general formula (2) include, but not particularly limited to, linear, branched, or cyclic alkyl groups each having 1 to 20 carbon atoms such as a methyl group, a butyl group, an octyl group, a dodecyl group, a nonadecyl group, a cyclobutyl group, a cyclopentyl group, a cyclohexyl group, a methylcyclohexyl group, and an ethylhexyl group. Of those, a methyl group is particularly preferred.

Examples of the halogen atom represented by any one of $X_1$ and $X_2$ in the general formula (2) include a fluorine atom, a chlorine atom, a bromine atom, and an iodine atom.

Preferred specific examples of the pigment having the quinacridone skeleton represented by the general formula (2) include C.I. Pigment Red 122, C.I. Pigment Red 202, and C.I. Pigment Violet 19 (each based on a name described in Color Index, 4th Edition).

The pigment having the quinacridone skeleton can be used alone, or can be used in combination with two or more kinds of known magenta pigments or dyes.

Pigment Dispersion

The term "dispersion medium" as used in the present invention refers to water or an organic solvent.

The pigment dispersion of the present invention is obtained by subjecting at least the compound represented by the general formula (1) and the pigment having the quinacridone skeleton to a dispersion treatment in the dispersion medium.

The pigment having the quinacridone skeleton can be dispersed by a known method.

The pigment dispersion of the present invention is obtained, for example, as described below. The compound represented by the general formula (1), and as required, a resin are dissolved in the dispersion medium. While the solution is stirred, the powder of the pigment having the quinacridone skeleton is gradually added to the solution to be caused to sufficiently blend to the dispersion medium. Further, a mechanical shear force is applied to the mixture with a dispersing machine. Thus, the pigment can be stably finely dispersed in a uniform, fine particulate manner.

Although the dispersing machine to be used in the present invention is not particularly limited, for example, a media-type dispersing machine such as a rotation shearing-type homogenizer, a ball mill, a sand mill, or an attritor, or a high-pressure, opposing collision-type dispersing machine is preferably used.

The amount of the pigment in the pigment dispersion of the present invention is 1.0 to 30.0 parts by mass, preferably 2.0 to 20.0 parts by mass, more preferably 3.0 to 15.0 parts by mass with respect to 100 parts by mass of the dispersion medium. The amount preferably falls within the range because the pigment dispersion obtains good coloring power and an increase in its viscosity hardly occurs.

The compound represented by the general formula (1) can be used in an amount of 0.01 to 10 parts by mass with respect to 100 parts by mass of the pigment having the quinacridone skeleton, though the usage is not limited as long as the dispersibility is not affected. The compound is used in an amount of preferably 0.05 to 10 parts by mass, more preferably 0.1 to 5 parts by mass.

The pigment dispersion of the present invention can be dispersed in water with an emulsifier in order that good dispersion stability may be obtained. Examples of the emulsifier include, but not particularly limited to, a cationic surfactant, an anionic surfactant, and a nonionic surfactant.

The cationic surfactant to be used as the emulsifier in the present invention is not particularly limited, and examples thereof include dodecylammonium chloride, dodecylammonium bromide, dodecyltrimethylammonium bromide, dodecylpyridinium chloride, dodecylpyridinium bromide, and hexadecyltrimethylammonium bromide.

In addition, examples of the anionic surfactant include fatty acid soaps such as sodium stearate and sodium dodecanoate, sodium dodecylsulfate, sodium dodecylbenzenesulfate, and sodium laurylsulfate.

Further, the nonionic surfactant is not particularly limited, and examples thereof include dodecylpolyoxyethylene ether, hexadecylpolyoxyethylene ether, nonylphenylpolyoxyethylene ether, laurylpolyoxyethylene ether, sorbitanmonooleate-polyoxyethylene ether, and monodecanoyl sucrose.

The organic solvent that may be used as the dispersion medium of the pigment dispersion of the present invention is determined depending on an intended application of the pigment and is not particularly limited. Specific examples thereof include: alcohols such as methyl alcohol, ethyl alcohol, modified ethyl alcohol, isopropyl alcohol, n-butyl alcohol, isobutyl alcohol, tert-butyl alcohol, sec-butyl alcohol, tert-amyl alcohol, 3-pentanol, octyl alcohol, benzyl alcohol, and cyclohexanol; glycols such as methyl cellosolve, ethyl cellosolve, diethylene glycol, and diethylene glycol monobutyl ether; ketones such as acetone, methylethyl ketone, and methylisobutyl ketone; esters such as ethyl acetate, butyl acetate, ethyl propionate, and cellosolve acetate; hydrocarbon-based solvents such as hexane, octane, petroleum ether, cyclohexane, benzene, toluene, and xylene; halogenated hydrocarbon-based solvents such as carbon tetrachloride, trichloroethylene, and tetrabromoethane; ethers such as diethyl ether, dimethyl glycol, trioxane, and tetrahydrofuran; acetals such as methylal and diethyl acetal; organic acids such as formic acid, acetic acid, and propionic acid; and sulfur/nitrogen-containing organic compounds such as nitrobenzene, dimethylamine, monoethanolamine, pyridine, dimethyl sulfoxide, and dimethylformamide.

A polymerizable monomer may also be used as the organic solvent to be used in the present invention. The polymerizable monomer is an addition polymerizable or condensation polymerizable monomer, preferably an addition polymerizable monomer. Specific examples thereof may include: styrene-based monomers such as styrene, o-methylstyrene, m-methylstyrene, p-methylstyrene, o-ethylstyrene, m-ethylstyrene, and p-ethylstyrene; acrylate-based monomers such as methyl acrylate, ethyl acrylate, propyl acrylate, butyl acrylate, octyl acrylate, dodecyl acrylate, stearyl acrylate, behenyl acrylate, 2-ethylhexyl acrylate, dimethylaminoethyl acrylate, diethylaminoethyl acrylate, acrylonitrile, and amide acrylate; methacrylate-based monomers such as methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethylaminoethyl methacrylate, diethylaminoethyl methacrylate, methacrylonitrile, and amide methacrylate; olefin-based monomers such as ethylene, propylene, butylene, butadiene, isoprene, isobutylene, and cyclohexene; halogenated vinyls such as vinyl chloride, vinylidene chloride, vinyl bromide, and vinyl iodide; vinyl esters such as vinyl acetate, vinyl propionate, and vinyl benzoate; vinyl ethers such as vinylmethyl ether, vinylethyl ether, and vinylisobutyl ether; and vinyl ketone compounds such as vinylmethyl ketone, vinylhexyl ketone, and methylisopropenyl ketone. One kind of those monomers may be used alone, or two or more kinds thereof may be used in combination depending on an application.

A resin may be further added to the pigment dispersion.

The resin that may be used in the pigment dispersion is determined depending on an intended application and is not particularly limited. Specific examples thereof include a polystyrene resin, a styrene copolymer, a polyacrylic acid resin, a polymethacrylic acid resin, a polyacrylic acid ester resin, a polymethacrylic acid ester resin, an acrylic acid-based copolymer, a methacrylic acid-based copolymer, a polyester resin, a polyvinyl ether resin, a polyvinylmethyl ether resin, a polyvinyl alcohol resin, and a polyvinylbutyral resin. Other examples include a polyurethane resin and a polypeptide resin. One kind of those resins may be used alone, or two or more kinds thereof may be used as a mixture.

Any other colorant can be used in combination as a colorant constituting the pigment dispersion of the present invention as long as the colorant does not impair the dispersibility of the pigment dispersion of the present invention. Examples of the colorant that can be used in combination include various compounds such as compounds typified by a condensed azo compound, an anthraquinone compound, an azo metal complex, a methine compound, and an arylamide compound.

The pigment dispersion of the present invention has a vivid color tone, and can be used as a magenta colorant, preferably a material for recording image information because of its excellent spectral characteristics. For example, when the dispersion medium is an aqueous medium, the pigment dispersion can be used as a colorant for an inkjet ink, aqueous ink for printing, aqueous paint, aqueous ink for a writing instrument, or the like. In addition, when the dispersion medium is an organic solvent-based medium, the pigment dispersion can be used as a colorant for a resist composition for a color filter, solvent ink for printing, oil paint, solvent ink for a writing instrument, or the like.

Resist Composition for Color Filter

The pigment dispersion of the present invention has a vivid red color tone, and can be used as a coloring material for a red color, preferably a colorant for a color filter because of its spectral characteristics.

When a resist composition for a color filter is prepared by using the liquid composition of the present invention, the composition can be provided as a resist composition of an arbitrary color by using any other colorant in combination. The composition is preferably provided as a red resist composition without using any other colorant in combination or by using the other colorant in combination in such an amount that the color tone of the liquid composition of the present invention is not impaired.

The resist composition of the present invention contains at least a binder resin, a photopolymerizable monomer, a photopolymerization initiator, a solvent, and one or more kinds of the pigment dispersions of the present invention.

In addition, in a color filter obtained by arraying two or more kinds of pixels having different spectral characteristics on a substrate so that the pixels may be adjacent to each other, when the pigment dispersion of the present invention is used in at least one of the multiple pixels (such as red, green, and blue pixels), a pixel that is highly transparent and has a high color purity can be obtained. A mixture of the pigment dispersion of the present invention and a dye may be used because the spectral characteristics can be improved by further mixing the dye. Two or more kinds of dyes may be used as a mixture in order that a desired hue may be obtained.

The content of the pigment having the quinacridone skeleton of the present invention is preferably 0.1 to 400 parts by mass, more preferably 1 to 200 parts by mass with respect to 100 parts by mass of the following binder resin.

The binder resin that can be used in the resist composition for a color filter of the present invention is not particularly limited as long as its light irradiation portion or light-shielding portion can be dissolved with an organic solvent, an alkali aqueous solution, water, or a commercially available developing solution. Further, the binder resin more preferably has such composition as to be capable of water or alkali development from the viewpoints of, for example, workability and waste disposal.

Generally known as such resin is a binder resin obtained by copolymerizing such a hydrophilic monomer as typified by acrylic acid, methacrylic acid, 2-hydroxyethyl, acrylamide, N-vinylpyrrolidone, a monomer having an ammonium salt, or the like and such a lipophilic monomer as typified by an acrylic acid ester, a methacrylic acid ester, vinyl acetate, styrene, N-vinylcarbazole, or the like at a moderate mixing ratio by a known approach. Such binder resin can be used as a negative resist, that is, a resist of such a type that its light-shielding portion is removed by development through combination with a radically polymerizable monomer having an ethyleny unsaturated group, a cationically polymerizable monomer having an oxirane ring or an oxetane ring, a radical generator, an acid generator, or a base generator.

A binder resin typified by, for example, a tert-butyl carbonate, tert-butyl ester, tetrahydroxypyranyl ester, or tetrahydroxypyranyl ether of a polyhydroxystyrene can also be used. The binder resin of this kind can be used as a positive resist, that is, a resist of such a type that its light irradiation portion is removed by development through combination with an acid generator.

The resist composition for a color filter of the present invention contains a photopolymerizable monomer having one or more ethyleny unsaturated double bonds as a monomer having an ethyleny unsaturated double bond that undergoes addition polymerization through irradiation with light. The photopolymerizable monomer is, for example, a compound having at least one addition polymerizable, ethyleny unsaturated group in a molecule thereof and having a boiling point of 100° C. or more at normal pressure. Examples thereof may include: monofunctional acrylates such as polyethylene glycol monoacrylate, polyethylene glycol monomethacrylate, polypropylene glycol monoacrylate, polypropylene glycol monomethacrylate, phenoxyethyl acrylate, and phenoxyethyl methacrylate; and polyfunctional acrylates and polyfunctional methacrylates including polyfunctional acrylates and methacrylates such as polyethylene glycol diacrylate, polyethylene glycol dimethacrylate, polypropylene glycol diacrylate, polypropylene glycol dimethacrylate, trimethylolethane triacrylate, trimethylolethane trimethacrylate, trimethylolpropane triacrylate, trimethylolpropane trimethacrylate, trimethylolpropane diacrylate, trimethylolpropane dimethacrylate, neopentyl glycol diacrylate, neopentyl glycol dimethacrylate, pentaerythritol tetraacrylate, pentaerythritol tetramethacrylate, pentaerythritol triacrylate, pentaerythritol trimethacrylate, dipentaerythritol hexaacrylate, dipentaerythritol hexamethacrylate, dipentaerythritol pentaacrylate, dipentaerythritol pentamethacrylate, hexanediol diacrylate, hexanediol dimethacrylate, trimethylolpropane tri(acryloyloxypropyl) ether, tri(acryloyloxyethyl) isocyanurate, tri(acryloyloxyethyl) cyanurate, glycerin triacrylate, and glycerin trimethacrylate, and products each obtained by adding ethylene oxide or propylene oxide to a polyfunctional alcohol such as trimethylolpropane or glycerin and subjecting the resultant to acrylation or methacrylation.

Further examples include polyfunctional acrylates and methacrylates such as urethane acrylates, polyester acrylates, and epoxy acrylates each of which is a reaction product of an epoxy resin and acrylic acid or methacrylic acid. Of the above-mentioned compounds, trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, dipentaerythritol pentaacrylate, and dipentaerythritol pentamethacrylate are preferred.

One kind of photopolymerizable monomers each having two or more ethyleny unsaturated double bonds may be used alone, or two or more kinds thereof may be used as a mixture. The content of the polymerizable compound is generally 5 to 50 mass %, particularly preferably 10 to 40 mass % of the mass (total solid content) of the colored photosensitive composition.

When the resist composition for a color filter of the present invention is UV curable, the resist composition is constituted by incorporating a photopolymerization initiator. Examples of the photopolymerization initiator include a vicinal polyketoaldonyl compound, an α-carbonyl compound, an acyloin ether, a multi-quinone compound, a combination of a triallylimidazole dimer and a p-aminophenylketone, and a trioxadiazole compound. The initiator is preferably, for example, 2-benzyl-2-dimethylamino-1-(4-morpholinophenyl)butanone (trade name: IRGACURE 369, manufactured by BASF). It should be noted that the photopolymerization initiator is not essential when an electron beam is used upon formation of a pixel with the colored resist of the present invention.

The resist composition for a color filter of the present invention contains a solvent for dissolving or dispersing the binder resin, the photopolymerizable monomer, the photopolymerization initiator, the colorant, and the like. Examples of the solvent that may be used include cyclohexanone, ethyl cellosolve acetate, butyl cellosolve acetate, 1-methoxy-2-propyl acetate, diethylene glycol dimethyl ether, ethylbenzene, 1,2,4-trichlorobenzene, ethylene glycol diethyl ether, xylene, ethyl cellosolve, methyl n-amyl ketone, propylene glycol monomethyl ether, toluene, methylethyl ketone, ethyl acetate, methanol, ethanol, isopropyl alcohol, butanol, isobutyl ketone, and a petroleum-based solvent. One kind of those solvents may be used alone, or two or more kinds thereof may be used as a mixture.

As described above, the resist composition for a color filter of the present invention is constituted by incorporating the pigment dispersion of the present invention as a colorant. Accordingly, a pixel to be formed with the composition has a good hue, and its transparency and translucency can be improved.

Ink

An ink composition capable of utilizing the pigment dispersion of the present invention as an ink can be produced. The case where the dispersion medium is an aqueous medium is particularly preferred. A mixed solvent of water and a water-soluble organic solvent may also be used. The water-soluble organic solvent to be used at this time is not limited as long as the solvent shows water solubility, and examples thereof include an alcohol, a polyhydric alcohol, a polyethylene glycol, a glycol ether, a nitrogen-containing polar solvent, and a sulfur-containing polar solvent.

When an ink containing the pigment dispersion of the present invention is produced, the pH of the ink, which is not particularly limited, preferably falls within the range of 4.0 to 11.0 in consideration of safety. In addition, when an inkjet ink is produced, a moisture-retaining solid matter such as urea, a urea derivative, or trimethylolpropane may be used as an ink component for maintaining the retentivity of the ink. In general, the content of the moisture-retaining solid matter such as urea, a urea derivative, or trimethylolpropane in the ink falls within the range of preferably 0.1 mass % or more and 20.0 mass % or less, more preferably 3.0 mass % or more and 10.0 mass % or less with respect to the ink.

Further, when an ink is produced, various additives such as a pH adjustor, a rust inhibitor, an antiseptic, a mildew proofing agent, an antioxidant, a reduction inhibitor, an evaporation accelerator, a chelating agent, and a water-soluble polymer as well as the components may each be incorporated as required.

The ink containing the pigment dispersion of the present invention as described above is particularly suitably used in an inkjet recording mode involving ejecting a liquid droplet by means of the action of thermal energy to perform recording. Needless to say, the ink containing the pigment dispersion of the present invention can be used as an ink to be applied to any other inkjet recording method or as a material for a general writing instrument or the like.

Hereinafter, the present invention is described in more detail by way of examples and comparative examples. However, the present invention is not limited to these examples. It should be noted that the terms "part(s)" and "%" in the following description refer to "part(s) by mass" and "mass %," respectively unless otherwise stated. The identification of the resultant reaction product was performed by multiple analysis methods involving using the following apparatus. That is, the analysis apparatus used were $^1$H and $^{13}$C nuclear magnetic resonance spectrometer (ECA-400, manufactured by JEOL Ltd.) and LC/TOF MS (LC/MSD TOF, manufactured by Agilent Technologies). It should be noted that an electrospray ionization method (ESI) was applied to an ionization method in the LC/TOF MS.

(Production of Compound Represented by General Formula (1))

The compound represented by the general formula (1) of the present invention, which is commercially available, can be synthesized by a known method.

The compound represented by the general formula (1) of the present invention was produced by the following method.

Production Example 1

Production Example of Compound (16)

102 Grams of acetic anhydride were loaded into a solution of 76.9 g of 4-bromo-1-cyclohexylaminoanthraquinone in 20 g of 1,2-dichlorobenzene and then 1 g of concentrated sulfuric acid was charged into the mixture, followed by stirring at 110° C. for 6 hours. After the completion of the reaction, the reaction product was diluted with 1,000 g of methanol and filtered. Thus, 59.8 g of 1-(acetylcyclohexylamino)-4-bromoanthraquinone were obtained (70.1% yield). Further, a solution of 12 g of caustic soda in 150 g of water was dropped to a solution of 1-(acetylcyclohexylamino)-4-bromoanthraquinone in 150 g of isobutanol and then the mixture was stirred at 90° C. for 6 hours. After the completion of the reaction, the reaction product was cooled and then the resultant solid was separated by filtration. Thus, 28.7 g of 4-bromo-1,9-N-cyclohexylanthrapyridone were obtained (70.4% yield). Next, 19.3 g of 4-methylanilinehexylamine, 8.6 g of sodium carbonate, and 6.8 g of copper powder were loaded into a solution of 20.4 g of 4-bromo-1,9-N-cyclohexylanthrapyridone in 40 g of 1,3-dimethyl-2-imidazolidine, and then the mixture was subjected to a reaction at 190° C. for 4 hours. After the completion of the reaction, the reaction product was cooled, diluted with ethyl acetate, and filtered. The filtrate was purified by column chromatography (toluene/THF). Thus, 17.6 g of a compound (16) were obtained (85.0% yield). FIG. 1 illustrates the $^1$H-NMR spectrum of the compound (16) in CDCl$_3$ at room temperature and 400 MHz.

(Analysis Results of Compound (16))

(1) $^1$H-NMR (400 MHz, CDCl$_3$, room temperature): δ [ppm]=1.35-1.97 (m, 10H), 2.37 (s, 3H), 2.37-2.54 (br, 1H), 7.23 (dd, 4H, 14.4, 8.93 Hz), 7.52 (d, 1H, J=9.62 Hz), 7.65-7.77 (m, 3 Hz), 7.89 (s, 1H), 8.23 (d, 1H, J=7.79 Hz), 8.51 (dd, 1H, J=7.79, 1.37 Hz), 12.1 (s, 1H)

(2) Mass spectroscopy (ESI-TOF): m/z=433.1932 (M-H)$^+$

Production Examples of Other Coloring Matter Compounds

Other compounds shown in Table 1 below were each synthesized by a method in conformity with Production Example 1 described above. The structures of those compounds were identified in the same manner as in the compound described above. The symbol "*" represents the bonding site of a substituent.

(Production of Pigment Dispersion)

A pigment dispersion of the present invention and a comparative pigment dispersion were produced by the following methods.

Example 1

120 Parts of styrene were mixed into a mixture of 17 parts of C.I. Pigment Red 122 (manufactured by Clariant, trade name "Toner Magenta E") and 0.85 part of a compound (1) represented by the general formula (1) of the present invention, followed by dispersion with an attritor (manufactured by Mitsui Mining Co., Ltd.) for 1 hour. Thus, a pigment dispersion (1) of the present invention was obtained.

Examples 2 to 32

Figure 2:
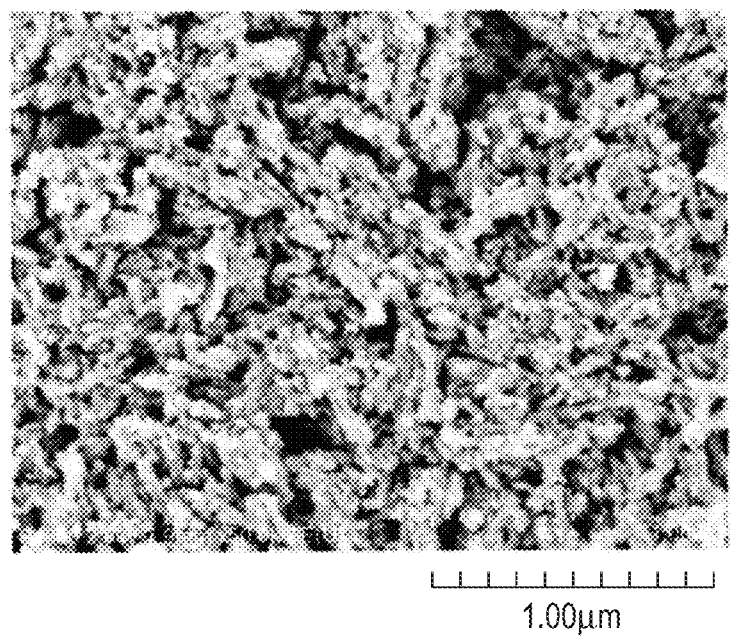
FIG. 2 is a view illustrating the SEM photograph of a pigment dispersion (2) using a compound (2) represented by the general formula (1) of the present invention.

Pigment dispersions (2) to (32) were each obtained in the same manner as in Example 1 except that the compound (1) in Example 1 was changed to any one of compounds (2) to (32). FIG. 2 illustrates a figure based on the SEM photograph of the pigment dispersion (2).

Comparative Example 1

A comparative pigment dispersion (1) was obtained in the same manner as in Example 1 except that the compound (1) in Example 1 was not loaded.

Comparative Examples 2 to 6

Comparative pigment dispersions (2) to (6) were each obtained in the same manner as in Example 1 except that the compound (1) in Example 1 was changed to any one of comparative compounds (1) to (5) shown in Table 2.

Evaluation (Dispersibility)

A pigment dispersion was evaluated for its dispersibility as described below. It has been found that there is a correlation between the dispersion particle diameter of a pigment and gloss after development on paper. The dispersibility of the pigment was determined by measuring the increase ratio of the gloss after the development on paper with a particle size-measuring device (grindmeter) (TESTER SANGYO CO., LTD.).

A: The increase ratio of the gloss is 15% or more (the dispersibility is extremely good).

B: The increase ratio of the gloss is 5% or more and less than 15% (the dispersibility is good).

C: The increase ratio of the gloss is less than 5% (the dispersibility is bad).

Tables 1 and 2 show the results of the evaluation of the pigment dispersions in the examples and the pigment dispersions in the comparative examples of.

TABLE 1
| Example | Compound | R₁ | R₂ | λex | Gloss | Increase ratio (%) | Evaluation |
|---|---|---|---|---|---|---|---|
| Example 1 | (1) | CH₃ | 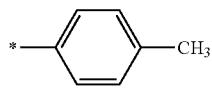 | 539 | 65.5 | 18 | A |
| Example 2 | (2) | CH₃ | 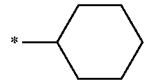 | 550 | 68.8 | 24 | A |
| Example 3 | (3) | CH₃ | 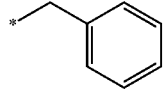 | 538 | 67.7 | 22 | A |
| Example 4 | (4) | CH₃ | 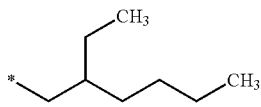 | 548 | 66 | 19 | A |
| Example 5 | (5) | CH₃ | 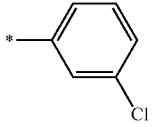 | 534 | 67.1 | 21 | A |
| Example 6 | (6) | CH₃ | 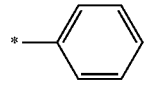 | 538 | 66 | 19 | B |
| Example 7 | (7) | CH₃ | 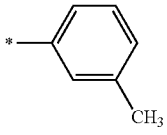 | 540 | 62.7 | 13 | B |
| Example 8 | (8) | CH₃ | 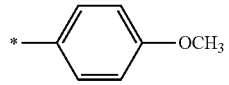 | 537 | 66.1 | 19 | B |
| Example 9 | (9) | CH₃ | 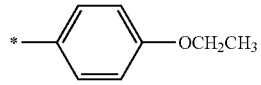 | 538 | 64.9 | 17 | A |
| Example 10 | (10) | CH₃ | 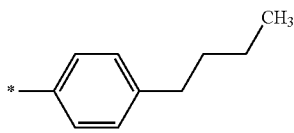 | 540 | 67.5 | 21 | A |
| Example 11 | (11) | CH₃ | 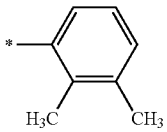 | 537 | 59.9 | 8 | B |
| Example 12 | (12) | CH₃ | 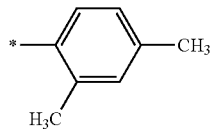 | 537 | 67.2 | 21 | A |

TABLE 1-continued
| Example | Compound | R₁ | R₂ | λex | Gloss | Increase ratio (%) | Evaluation |
|---|---|---|---|---|---|---|---|
| Example 13 | (13) | CH₃ | 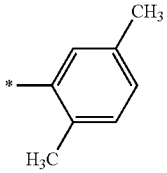 | 537 | 66.6 | 20 | A |
| Example 14 | (14) | CH₃ | 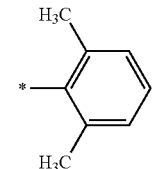 | 534 | 59.9 | 8 | B |
| Example 15 | (15) | CH₃ | 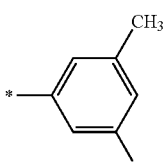 | 540 | 66.1 | 19 | A |
| Example 16 | (16) | 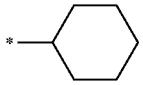 | 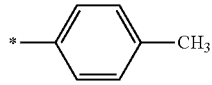 | 537 | 61.6 | 11 | B |
| Example 17 | (17) | n-Bu | 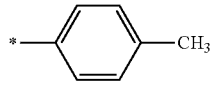 | 538 | 67.2 | 21 | A |
| Example 18 | (18) | 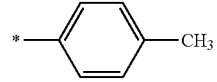 | 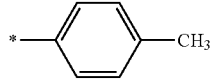 | 539 | 66 | 19 | A |
| Example 19 | (19) | 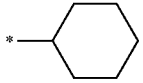 | 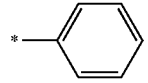 | 536 | 62.7 | 13 | B |
| Example 20 | (20) | 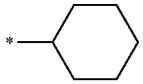 | 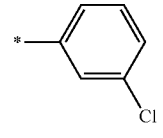 | 531 | 64.4 | 16 | A |
| Example 21 | (21) | 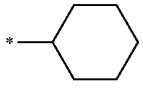 | 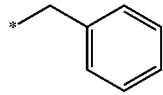 | 536 | 59.9 | 8 | B |
| Example 22 | (22) | 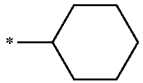 | 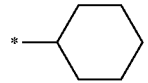 | 547 | 63.8 | 15 | A |
| Example 23 | (23) | 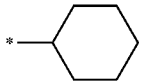 | 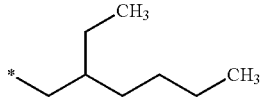 | 546 | 64.4 | 16 | A |
| Example 24 | (24) | n-Bu | 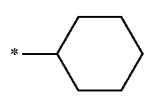 | 548 | 67.1 | 21 | A |

TABLE 1-continued

| Example | Compound | $R_1$ | $R_2$ | λex | Gloss | Increase ratio (%) | Evaluation |
|---|---|---|---|---|---|---|---|
| Example 25 | (25) | n-Bu | 2-ethylhexyl | 547 | 66.6 | 20 | A |
| Example 26 | (26) | 2-ethylhexyl | cyclohexyl | 550 | 65.5 | 18 | A |
| Example 27 | (27) | 2-ethylhexyl | 2-ethylhexyl | 549 | 66 | 19 | A |
| Example 28 | (28) | n-Bu | long alkyl chain $CH_3$ | 545 | 66.6 | 20 | A |
| Example 29 | (29) | n-Bu | cyclohexenyl-ethyl | 544 | 67.2 | 21 | A |
| Example 30 | (30) | n-Bu | $-(CH_2)_3-O-(CH_2)_2-CH_3$ | 544 | 65.5 | 18 | A |
| Example 31 | (31) | n-Bu | $-(CH_2)_3-O-CH_2-$(2-ethylhexyl) | 544 | 67.2 | 21 | A |
| Example 32 | (32) | n-Bu | 3-phenylpropyl | 541 | 64.9 | 17 | A |

TABLE 2

| Comparative Example | Compound | Structural formula for compound | Gloss | Increase ratio (%) | Evaluation |
|---|---|---|---|---|---|
| Comparative Example 1 | None | None | 55.5 | — | — |
| Comparative Example 2 | Comparative Compound (1) | 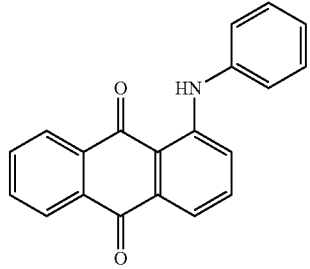 [SMILES: O=C1c2ccccc2C(=O)c2c(Nc3ccccc3)cccc21] | 56.0 | 1 | C |

TABLE 2-continued

| Comparative Example | Compound | Structural formula for compound | Gloss | Increase ratio (%) | Evaluation |
|---|---|---|---|---|---|
| Comparative Example 3 | Comparative Compound (2) | [anthraquinone with two 3-methylphenylamino groups] | 44.4 | −20 | C |
| Comparative Example 4 | Comparative Compound (3) | [anthraquinone with two 4-methylphenylamino groups] | 56.1 | 1 | C |
| Comparative Example 5 | Comparative Compound (4) | [azo naphthol compound with C$_8$H$_5$HNOC, OCH$_3$, H$_3$CO, Cl substituents] | 55.3 | 1 | C |
| Comparative Example 6 | Comparative Compound (5) | Solspers 24000 | 55.5 | 1 | C |

Examples 33 to 39

Pigment dispersions (33) to (39) were each obtained in the same manner as in Example 1 except that the compound (1) in Example 1 was changed as shown in Table 3. The same evaluation as that of Example 1 was performed with the resultant pigment dispersions.

Table 3 shows the results.

TABLE 3

| Example | Compound | Usage (part(s)) | Gloss | Increase ratio (%) | Evaluation |
|---|---|---|---|---|---|
| Example 33 | (17) | 1.19 | 67.3 | 21 | A |
| Example 34 | (25) | 0.17 | 63.0 | 14 | B |
| Example 35 | (25) | 0.51 | 65.0 | 17 | A |
| Example 36 | (25) | 1.36 | 66.0 | 19 | A |
| Example 37 | (25) | 1.70 | 64.4 | 16 | A |
| Example 38 | (27) | 0.34 | 63.2 | 14 | B |
| Example 39 | (31) | 0.51 | 66.1 | 19 | A |

Examples 40 to 42

Pigment dispersions (40) to (42) were each obtained in the same manner as in Example 1 except that a combination of compounds shown in Table 4 was used in blending amounts shown in Table 4 instead of C.I. Pigment Red 122 and the compound (1) in Example 1. The same evaluation as that of Example 1 was performed with the resultant pigment dispersions. Table 4 shows the results.

It should be noted that, in Table 4, C.I. Pigment Red 122, C.I. Pigment Red 202, and C.I. Pigment Violet 19 are abbreviated as P.R. 122, P.R. 202, and P.V. 19, respectively.

TABLE 4

| Example | Compound represented by general formula (2) | Compound represented by general formula (1) | Increase ratio (%) | Evaluation |
|---|---|---|---|---|
| Example 40 | P.R. 122 (15 parts) + P.V. 19 (2 parts) | (17) | 21 | A |
| Example 41 | P.R. 122 (16 parts) + P.V. 19 (1 part) | (25) | 20 | A |
| Example 42 | P.R. 122 (16 parts) + P.R. 202 (2 parts) | (25) | 19 | A |

As is apparent from Table 1 to Table 4, the pigment dispersion obtained in the present invention is excellent in dispersibility of a pigment because its gloss increases as compared with that of the corresponding comparative pigment dispersion.

Preparation of Red Resist Composition

Example 43

120 Parts of cyclohexanone were mixed into a mixture of 12 parts of C.I. Pigment Red 122 (manufactured by Clariant, trade name "Toner Magenta E") and 0.12 part of a compound (4), followed by dispersion with an attritor (manufactured by Mitsui Mining Co., Ltd.) for 1 hour. Thus, a pigment dispersion (1) for a red resist composition of the present invention was obtained.

22 Parts of the pigment dispersion (1) for a red resist were slowly added to a solution of 6.7 parts of an acrylic copolymerizable composition, 1.3 parts of dipentaerythritol pentaacrylate, and 0.4 part of 2-benzyl-2-dimethylamino-1-(4-morpholinophenyl)butanone (photopolymerization initiator) in 96 parts of cyclohexanone, and then the mixture was stirred at room temperature for 3 hours. The mixture was filtered through a 1.5-μm filter. Thus, a red resist composition was obtained.

Examples 44 to 51

Red resist compositions (2) to (9) were each obtained in the same manner as in Example 43 except that any one of the compounds shown in Table 5 was used instead of the compound (4) in Example 43.

Upon filtration with the 1.5-μm filter during the operations, the red resist composition of the present invention was able to be smoothly filtered without causing any clogging the filter because of its excellent dispersibility.

TABLE 5

| Example | Compound | Usage (part(s)) | Red resist composition |
|---|---|---|---|
| Example 44 | (10) | 0.12 | (2) |
| Example 45 | (12) | 0.17 | (3) |
| Example 46 | (17) | 0.17 | (4) |
| Example 47 | (18) | 0.96 | (5) |
| Example 48 | (24) | 0.25 | (6) |
| Example 49 | (25) | 1.20 | (7) |
| Example 50 | (28) | 0.12 | (8) |
| Example 51 | (31) | 0.60 | (9) |

Each red resist composition obtained in the foregoing was applied onto glass by spin coating. After that, the composition was dried at 90° C. for 3 minutes, subjected to whole exposure, and subjected to post curing at 180° C. Thus, a coating sample was produced. Both the light permeability and color tone of the resultant coating sample were good.

Preparation of Ink

Example 52

60 Parts of water were mixed into a mixture of 6 parts of C.I. Pigment Red 122 (manufactured by Clariant, trade name "Toner Magenta E"), 0.06 part of a compound (23), and 1.2 parts of sodium dodecyl sulfate, followed by dispersion with an attritor (manufactured by Mitsui Mining Co., Ltd.) for 1 hour. Thus, a pigment dispersion (1) for an ink of the present invention was obtained. Further, 1 part of an acetylenol EH (manufactured by Kawaken Fine Chemicals Co., Ltd.), 7.5 parts of ethylene glycol, 7.5 parts of glycerin, and 7.5 parts of urea were added to 74 parts of the pigment dispersion (1) for an ink, and then the mixture was sufficiently stirred. Thus, an ink (1) was produced.

Examples 53 to 62

Inks (2) to (11) were each obtained in the same manner as in Example 52 except that a combination of compounds shown in Table 6 was used in blending amounts shown in Table 6 instead of C.I. Pigment Red 122 and the compound (23) in Example 52.

TABLE 6

| Example | Compound represented by general formula (2) | Compound represented by general formula (1) | Ink |
|---|---|---|---|
| Example 52 | P.R. 122 (6 parts) | (23) (0.06 part) | (1) |
| Example 53 | P.R. 122 (6 parts) | (8) (0.06 part) | (2) |
| Example 54 | P.R. 122 (6 parts) | (10) (0.12 part) | (3) |
| Example 55 | P.R. 122 (6 parts) | (13) (0.06 part) | (4) |
| Example 56 | P.R. 122 (6 parts) | (17) (0.06 part) | (5) |
| Example 57 | P.R. 122 (6 parts) | (20) (0.30 part) | (6) |
| Example 58 | P.R. 122 (6 parts) | (24) (0.06 part) | (7) |
| Example 59 | P.R. 122 (6 parts) | (27) (0.60 part) | (8) |
| Example 60 | P.R. 122 (5 parts) + P.V. 19 (1 part) | (17) (0.06 part) | (9) |
| Example 61 | P.R. 122 (4 parts) + P.V. 19 (2 parts) | (25) (0.06 part) | (10) |
| Example 62 | P.R. 122 (3 parts) + P.R. 202 (3 parts) | (25) (0.06 part) | (11) |

Both the color tone and storage stability of each ink sample obtained in the foregoing were good.

An evaluation for the storage stability was performed by: sealing each ink composition in a glass sample bottle; leaving the bottle at rest under an environment at 40° C. for 1 month; and confirming the presence or absence of a precipitate. As a result, it was confirmed that no precipitate occurred in each case.

An image sample was produced by: applying each ink to a contrast ratio measurement paper by a bar coating method (Bar No. 10); and air-drying the ink overnight. The color tone of each image sample was identified by measuring its chromaticity (L*, a*, b*) in an L*a*b* colorimetric system with a reflection densitometer SpectroLino (manufactured by Gretag Macbeth).

INDUSTRIAL APPLICABILITY

According to the present invention, a pigment dispersion excellent in dispersibility of a colorant in a dispersion medium can be obtained. The use of the pigment dispersion can provide a paint composition which: is excellent in chromogenic property of the pigment, and in coating film performance such as the finished external appearance, weatherability, and physical properties of a coating film; and has so good dispersion stability of the pigment that the concentration of the pigment can be made high. Further, the use of the pigment dispersion can provide an ink composition having good chromogenic property and dispersion stability of the pigment, and excellent in clarity, transparency, chromogenic property, and the like. The pigment dispersion can also be used as a colorant for an inkjet ink, thermal transfer recording sheet, or color filter, or as a coloring matter for an optical recording medium.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-163949, filed Jul. 27, 2011, which is hereby incorporated by reference herein in its entirety.

The invention claimed is:

1. A pigment dispersion, comprising:
   a dispersion medium;
   a compound represented by a general formula (1), which is dispersed in the dispersion medium; and
   a pigment having a quinacridone skeleton, which is dispersed in the dispersion medium:

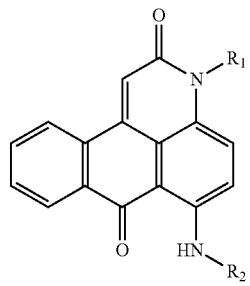

General formula (1)

in the general formula (1), $R_1$ and $R_2$ each independently represent a hydrogen atom, an alkyl group, an aryl group, or an aralkyl group.

2. The pigment dispersion according to claim 1, wherein the $R_1$ in the general formula (1) represents an alkyl group or an aryl group.

3. The pigment dispersion according to claim 1, wherein the $R_1$ in the general formula (1) represents a methyl group, an n-butyl group, a cyclohexyl group, an ethylhexyl group, or a 4-methylphenyl group.

4. The pigment dispersion according to claim 1, wherein the compound represented by the general formula (1) is used in an amount of 0.01 to 10 parts by mass with respect to 100 parts by mass of the pigment.

5. The pigment dispersion according to claim 1, wherein the pigment is represented by a general formula (2):

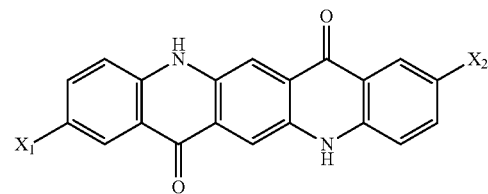

General formula (2)

in the general formula (2), $X_1$ and $X_2$ each represent a hydrogen atom, an alkyl group, or a halogen atom.

6. The pigment dispersion according to claim 1, wherein the pigment comprises at least one kind selected from the group consisting of C.I. Pigment Red 122, C.I. Pigment Red 202, and C.I. Pigment Violet 19.

7. A red resist composition for a color filter, comprising the pigment dispersion according to claim 1.

8. An ink composition, comprising the pigment dispersion according to claim 1.

* * * * *